(12) United States Patent
Romer et al.

(10) Patent No.: US 10,113,887 B2
(45) Date of Patent: Oct. 30, 2018

(54) SCALE FOR A LENGTH MEASURING SYSTEM AND METHOD FOR PRODUCING THE SAME

(71) Applicant: HAMILTON BONADUZ AG, Bonaduz (CH)

(72) Inventors: Hanspeter Romer, Hinwil (CH); Manuel Altmeyer, Rapperswil (CH); Martin Rupp, Schaan (LI)

(73) Assignee: Hamilton Bonaduz AG (CH)

( * ) Notice: Subject to any disclaimer, the term of this patent is extended or adjusted under 35 U.S.C. 154(b) by 369 days.

(21) Appl. No.: 14/889,317

(22) PCT Filed: Apr. 8, 2014

(86) PCT No.: PCT/EP2014/057063
§ 371 (c)(1),
(2) Date: Nov. 5, 2015

(87) PCT Pub. No.: WO2014/180614
PCT Pub. Date: Nov. 13, 2014

(65) Prior Publication Data
US 2016/0102998 A1  Apr. 14, 2016

(30) Foreign Application Priority Data
May 8, 2013  (DE) .......... 10 2013 104 782

(51) Int. Cl.
*G01D 5/245* (2006.01)
*G01D 5/241* (2006.01)
*G01D 5/347* (2006.01)
*H05K 1/02* (2006.01)

(52) U.S. Cl.
CPC ......... *G01D 5/2458* (2013.01); *G01D 5/2415* (2013.01); *G01D 5/34707* (2013.01); *H05K 1/0293* (2013.01); *H05K 1/0269* (2013.01)

(58) Field of Classification Search
CPC . G01D 5/2415; G01D 5/34707; G01D 5/2458
See application file for complete search history.

(56) References Cited

U.S. PATENT DOCUMENTS

| 2007/0069117 A1* | 3/2007 | Sakagami | G01D 3/024 |
| | | | 250/231.13 |
| 2010/0225333 A1* | 9/2010 | Uchida | G01D 5/2415 |
| | | | 324/658 |
| 2011/0192045 A1 | 8/2011 | Siraky | |

FOREIGN PATENT DOCUMENTS

| DE | 4237652 | 5/1994 |
| DE | 10117193 | 10/2002 |
| DE | 102007036836 A1 | 2/2009 |

(Continued)

*Primary Examiner* — Jermele M Hollington
*Assistant Examiner* — Feba Pothen
(74) *Attorney, Agent, or Firm* — Jansson Munger McKinley & Kirby Ltd.

(57) ABSTRACT

A scale and related method for a length-measuring system for recording the absolute values of angles or distances. The scale includes a printed circuit board, at least one track for identifying length information or angle information and a coding for identifying the scale. The coding has at least one coding element comprising at least two electrodes and a conductive connection between the electrodes on an insulator substrate. The electrical connection is configured to be irreversibly destroyed when an electrical current is applied.

13 Claims, 3 Drawing Sheets

(56) References Cited

FOREIGN PATENT DOCUMENTS

| | | |
|---|---|---|
| EP | 0986289 | 6/2000 |
| EP | 0836076 | 5/2002 |
| EP | 1770374 | 4/2007 |
| EP | 2357451 | 8/2011 |
| JP | 2006-170790 | 6/2006 |
| JP | 2012-149891 | 8/2012 |

\* cited by examiner

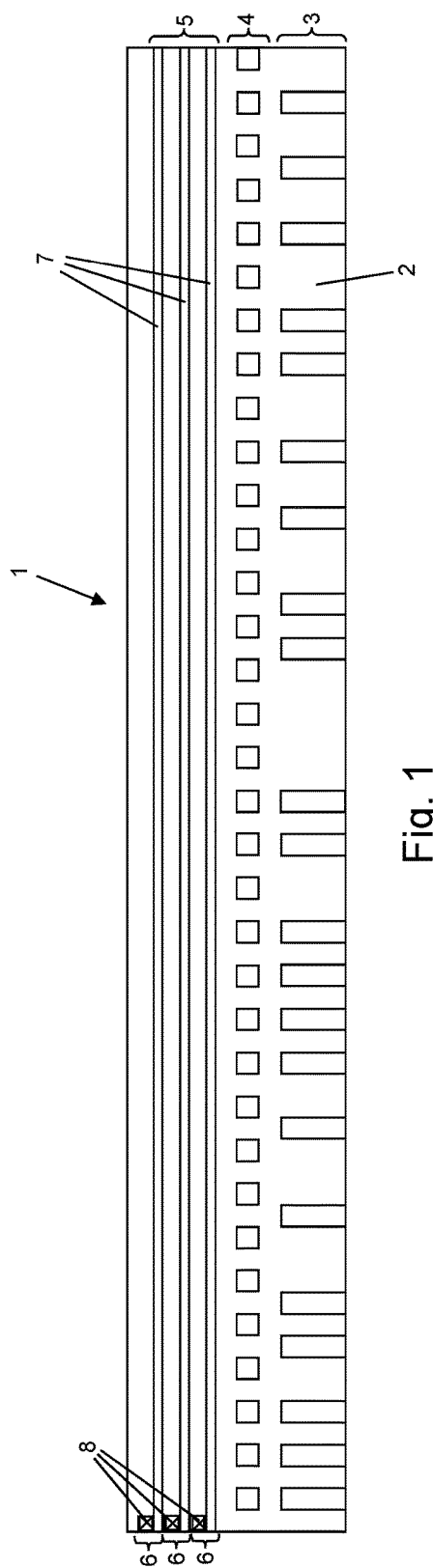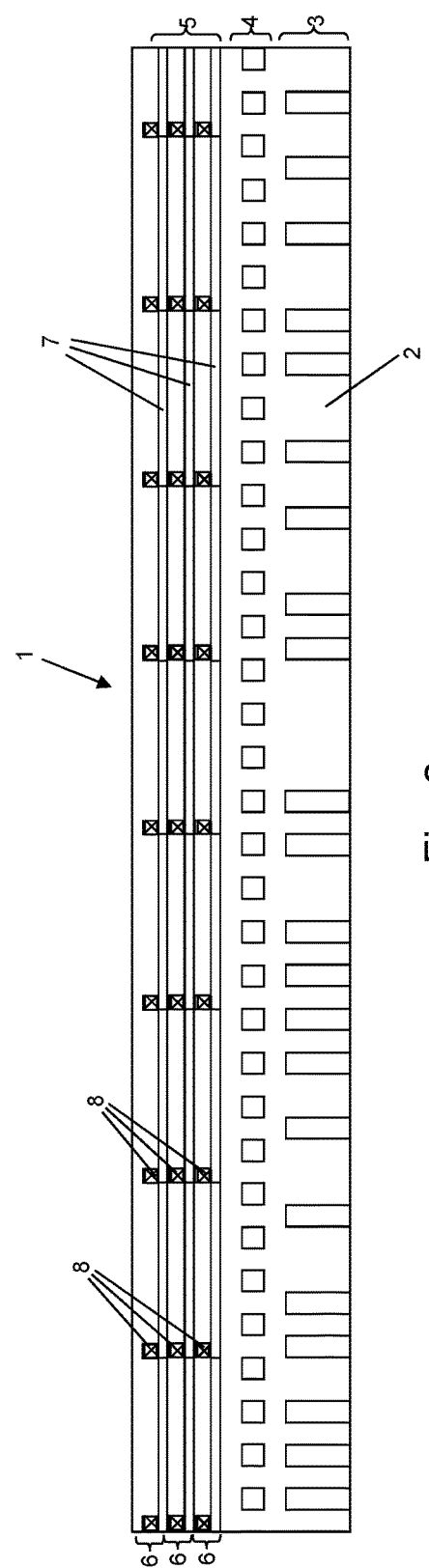

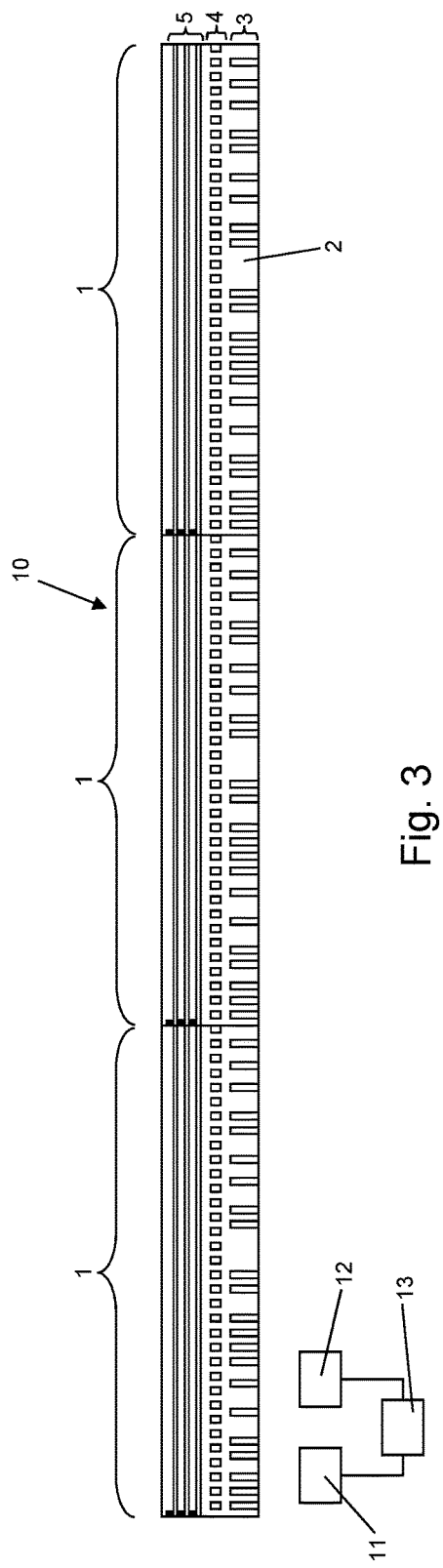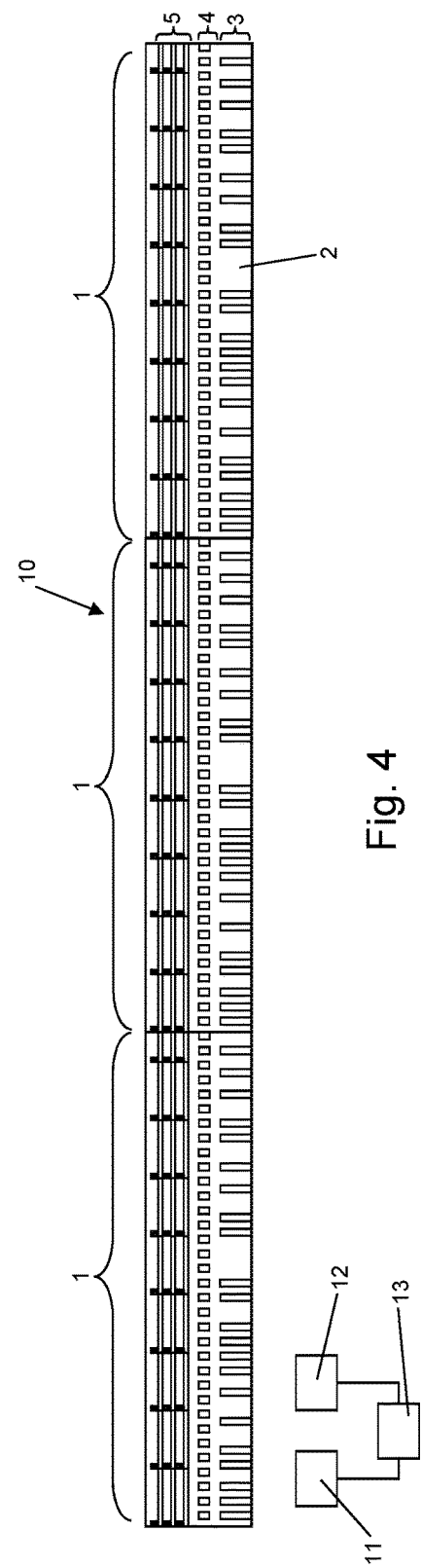

SCALE FOR A LENGTH MEASURING SYSTEM AND METHOD FOR PRODUCING THE SAME

CROSS-REFERENCE TO RELATED APPLICATIONS

This application is a national-phase entry under 35 USC § 371 of International Application No. PCT/EP2014/057063, filed on Apr. 8, 2014, which claims priority to German Patent Application No. DE 10 2013 104 782.3, which was filed on May 8, 2013. The entire disclosure and contents of these applications are incorporated by reference into the present application.

FIELD OF THE INVENTION

The present invention belongs to the areas of measurement and automation technology and pertains to a measuring system for recording the absolute values of angles or distances, such devices also being called transducers, linear encoders or angle encoders.

BACKGROUND OF THE INVENTION

Known length-measuring or angle-measuring systems comprise a plurality of similar scales and a sensor unit, which is moved along the scales and records the information stored thereon. Each scale comprises at least one absolute track or one relative track, also called an incremental track, and an element coding. The element coding serves to characterize or identify the otherwise identical scales, and thus, to determine the position for the sensor unit.

A known measuring system is disclosed in DE 101 17 193 A1, for example. This document discloses a measuring system with a plurality of scales arranged next to each other, each scale comprising an absolute track, an incremental track, and a coding track. The absolute and incremental tracks of the individual scales are identical; only the coding track differs from one scale to another.

The disadvantage of the measuring system of DE 101 17 193 A1 is that, although each individual scale comprises identical features such as absolute and incremental tracks, the coding track must be applied individually to each separate scale. This is very costly, especially in the case of optical systems.

A measuring system according to the capacitive measurement principle with absolute and incremental tracks applied as electrodes to a printed circuit board is disclosed in EP 0 836 076 A1.

It is therefore the object of the present invention to provide a measuring system which overcomes at least some of the above-cited disadvantages and which can be mass-produced at low cost with mature technologies and without complicated fabrication techniques.

This object is achieved by the subject matter having the features of the independent claims. Advantageous embodiments are described in the dependent claims.

BRIEF SUMMARY OF THE INVENTION

According to the invention, a scale for a length-measuring system for recording the absolute values of angles or distances is provided, the scale comprising, on a printed circuit board (PCB), at least one track for identifying length information or angle information and a coding for identifying the scale, wherein the coding has at least one coding element comprising at least two electrodes and a conductive connection between the electrodes on an insulator substrate, wherein the electrical connection is configured to be irreversibly destroyed by applying an electrical current. The decisive advantage of the scale according to the invention is that several scales of the identical type can be produced in the same way, and that, after they have been produced, they can be coded either before or after they have been incorporated into an appropriate measuring system. The conductive connection between the desired electrodes on the insulator substrate is irreversibly destroyed in the same way that a safety fuse is destroyed, wherein the appropriate thermal conductivity of the substrate material and of the conductive material must be taken into account, so that the sufficient power is made available to heat the electrical connection to the point that it melts through. Such scales are highly suitable for mass production, because the structures on the printed circuit board for the coding are extremely well adapted to the processing of large quantities. The appropriate current is applied to the electrodes individually for each coding element by connecting the desired electrode to a power source, the output of which is adapted to the materials as described above.

It is especially advantageous for the at least one coding element to be segmented into a plurality of coding segments, wherein each coding segment comprises two electrodes with a conductive connection between them. This results in a more accurate measurement, because parasitic capacitances are eliminated. Although each coding element then comprises more conductive connections which must be irreversibly destroyed, the length or angle measurement on the scale can be carried out with less susceptibility to error. The coding segments with their conductive connection can be spaced uniformly, for example, along the coding element or along the scale. One of the electrodes of each coding segment which is adjacent or present on the same side of the printed circuit board is preferably configured as a reference electrode or ground electrode.

At least one electrode of each coding segment is separated in terms of its potential from the corresponding adjacent electrode. When several coding segments are present, the electrical current for irreversibly destroying the conductive connection is therefore applied several times, i.e., once per coding segment. Because an auxiliary device with a number of contact elements corresponding to the number of conductive connections to be destroyed is used for the coding, i.e., the process of irreversible destruction, there is no significant increase in effort.

The scale preferably comprises an absolute track and an incremental track, wherein the absolute track and/or the incremental track is preferably formed as strip conductor, a magnetic trace, or a printed trace. If the absolute and incremental tracks are configured as strip conductors, the advantage is obtained that the same production technique can be used to produce all the tracks, including the coding or the coding track, on the scale, which lowers the cost of the fabrication process.

It is also advantageous that the printed circuit board is produced by photochemical means, by stamping or wire-laying methods, by screen printing, or by milling. Said technologies are mature methods well-adapted to the production of printed circuit boards and are preferred choices for the mass production of the scale according to the invention. The photochemical production method most often used in semiconductor technology is preferred.

The conductive connection preferably comprises a predetermined breaking point so that the destruction of the conductive connection achieved by the application of current is in fact irreversible. This ensures with a high degree of reliability that the coding of the scale can be achieved with precision.

It is especially preferable for a person to be able to subject both the intact and the irreversibly destroyed conductive connections to visual inspection. Thus, it is possible not only for a sensor but also for a human eye, with or without the optical assistance of a magnifying glass or the like, to determine whether or not each individual scale has been correctly coded. This leads to advantages during the installation of the scales in question.

Also according to the invention is a length-measuring system for recording the absolute value of angles or distances having a plurality of adjacent scales made as defined above, and a first sensor unit having at least one sensor for recording the length information or angle information and the coding of each of the plurality of scales, wherein the length information or angle information on the at least one track of each scale are identical, and wherein the coding of each scale of the length-measuring system is configured in such a way that it differs from another scale by at least one coding element. The formation of a length-measuring system of this type with a plurality of specially coded scales can thus be carried out easily, because the coding method used to code each individual scale can use the same infrastructure and is also simple to implement. The coding of the individual scales can be conducted flexibly, i.e., either before or after the individual scales are assembled, i.e., arranged next to each other, to form a complete measuring system.

It is advantageous for the length-measuring system to comprise a second sensor unit with at least one sensor for recording the length or angle data and the coding and also a control unit. Thus, upon the transition from one scale to the adjacent scale, all of the tracks are detected reliably. The control unit switches back and forth between the first and the second sensor unit as a function of the completeness with which the signal has been received. The first and second sensor units are preferably identical in structure in order to save additional cost. In other words, the second, identical, sensor unit creates a redundancy, which is especially important for the detection of the transitions between scales.

The measurement principle of the sensors in the first and second sensor units is preferably based on an optical, magnetic, inductive, electromagnetic, or capacitive measurement method or on a combination thereof. Sensors of this type are known in principle; they are based on physical measurement methods or parameters, e.g., a variable inductance or a variable capacitance.

Also according to the invention is a method for producing a length-measuring system for recording the absolute values of angles or distances comprising the following steps: (a) providing a plurality of identical scales as described above, wherein the length information or angle information on the at least one track of each scale and the coding elements of each scale of the length-measuring system are identical; (b) arranging the plurality of scales next to each other; and (c) identifying each of the plurality of scales by the selective application of current to at least one coding element, so that each of the scales is coded differently. Steps (b) and (c) can also be carried out in the reverse order.

BRIEF DESCRIPTION OF THE SEVERAL VIEWS OF THE DRAWINGS

The drawings illustrate preferred embodiments including the above-noted characteristics and features of the device. The device will be readily understood from the descriptions and drawings. In the drawings:

FIG. 1 is a schematic diagram of a first embodiment of the scale according to the invention;

FIG. 2 is a schematic diagram of a second embodiment of the scale according to the invention;

FIG. 3 is a schematic diagram of the length-measuring system of FIG. 1 according to the first embodiment;

FIG. 4 is a schematic diagram of the length-measuring system of FIG. 2 according to the second embodiment of the scale according to the invention;

DETAILED DESCRIPTION OF THE INVENTION

Figure 5:
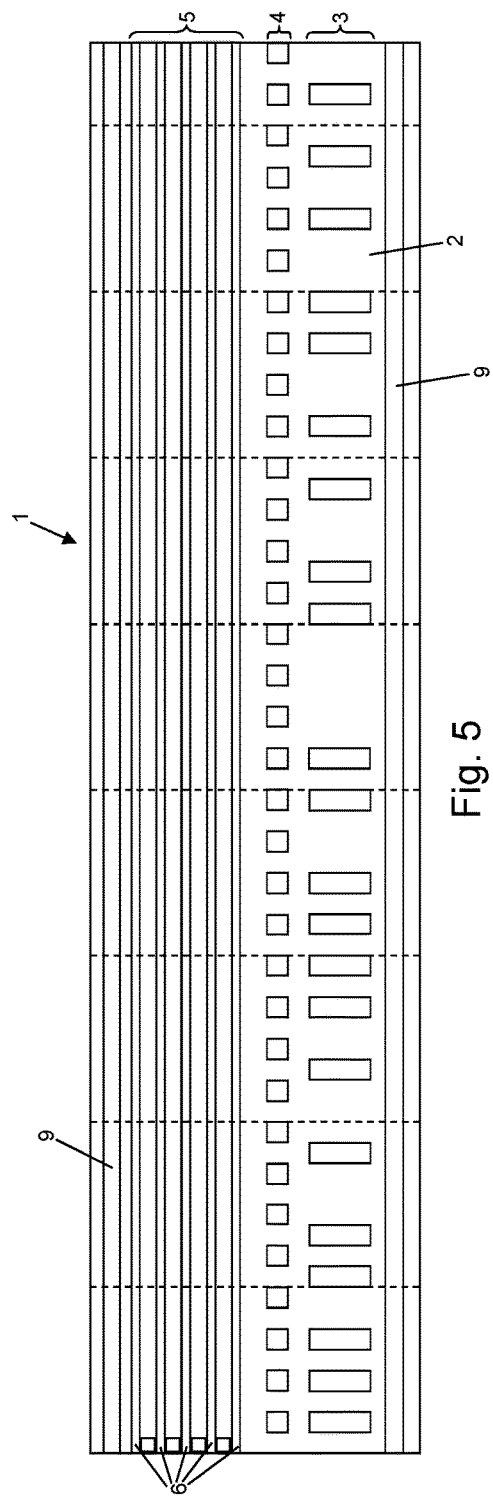
FIG. 5 is a schematic diagram of the front of a third embodiment of the scale according to the invention.

FIG. 1 shows a schematic diagram of a first embodiment of the scale according to the invention. Scale 1 comprises an absolute track 3, a relative or incremental track 4, and a coding 5, also called the "coding track," all applied to an insulator substrate 2. In the embodiment shown, absolute track 3 and relative track 4 are applied as conductive sections or strip conductors to insulator substrate 2 on the front of the scale. However, they can also be applied to the back. Alternatively, absolute and relative tracks 3, 4 could also be configured as optical tracks with light and dark sections. Similarly, the appropriately marked sections can also comprise different magnetic properties, i.e., magnetic and nonmagnetic sections can alternate. The two tracks 3 and 4 can thus be detected by a sensor adapted to the task.

Coding 5, comprising three coding elements 6, is arranged above absolute track 3 and relative track 4. Coding element 6 comprises two electrodes 7 and a conductive connection 8 between the two electrodes 7. As seen in FIG. 1, a first electrode 7 is formed as a strip conductor, whereas the second electrode (not visible in FIG. 1) is arranged, for example, as a reference electrode on the back of the printed circuit board (PCB). The second electrode could also be provided on the front of the printed circuit board (PCB). In the embodiment shown here, coding element 6 extends over the entire length of scale 1. As shown in FIG. 1, the one electrode 7 is arranged on the front of PCB substrate 2, but some other arrangement is also possible, such as on different sides of the PCB.

In this embodiment, conductive connection 8 of each coding element 6 is configured like a safety fuse extending between electrodes 7, wherein all three conductive connections are arranged along a line transverse to the longitudinal direction (on the left in FIG. 1). One possible embodiment of the conductive connection 8 is explained by way of example further below with reference to FIGS. 5 and 6. Through the arrangement of exactly three coding elements 6, each with its own irreversibly destroyable conductive connection 8, a maximum of $2^3$, i.e., 8, different possible codings are possible. Eight scales can therefore be arranged next to each other, each one having a different coding when in the functional state.

FIG. 2 shows a second embodiment of scale 1 according to the invention. Absolute and relative tracks 3, 4 arranged on insulator substrate 2 are identical to those of the first embodiment shown in FIG. 1. Coding 5 is again formed by three coding elements 6, similar to those of FIG. 1. Here, however, each coding element 6 in FIG. 2 has not just one but a plurality, specifically nine, conductive connections 8, each of which is arranged between two electrodes, one of which is visible on the front. All of the conductive connections 8 of a coding element 6 are therefore connected in the identical manner to electrodes 7. Because the nine conductive connections 8 are spaced essentially equally along the length of coding element 6 and along scale 1, the self-capacitances of electrodes 7, i.e., of the strip conductors, are smaller and have a smaller negative effect on the detection of the coding when, for example, the capacitive principle is used. A preferred embodiment of scale 1 comprises, for example, a length of 50 cm, wherein the space between adjacent conductive connections 8 is approximately 22 mm, which has been found to be especially advantageous for the measurement process. However, a larger or a smaller space is also possible.

The individualization of scale 1 according to the embodiment of FIG. 2 is carried out in a manner similar to that used for the embodiment of FIG. 1. An electrical current is applied, simultaneously or in succession, to electrodes 7 of each coding element 6, as a result of which all of the conductive connections 8 of coding element 6 are irreversibly destroyed. To achieve the effective coding of each coding element 6, it is necessary, for example, for each electrode of the corresponding coding segment and the ground or reference electrode to be contacted.

FIG. 3 shows a schematic diagram of a length-measuring system 10 according to the first embodiment of the present invention, wherein, by way of example, three scales 1 identical to the scale shown in FIG. 1 are arranged next to each other. The transition from one scale to the next must be as seamless and precise as possible, so that measurement inaccuracies can be reduced to a minimum. The most precise possible orientation of the scales in the longitudinal direction is also important. By means of fabrication techniques available today, especially those for circuit boards (PCBs), this can accomplished in almost all cases without undue effort.

A first sensor unit 11 and a second sensor unit 12 are arranged near length-measuring system 10 in such a way that they can detect absolute and relative tracks 3, 4 and/or coding 5. In the diagram of FIG. 3, sensor units 11, 12 are arranged next to length-measuring system 10 for the sake of clarity. It is obvious that, if a perpendicular detection angle, i.e., perpendicular to the plane of the drawing and to the plane of the scales, is required, the sensor units will be arranged above the scales to allow optimal detection. Sensors in the two sensor units 11, 12 can work according to the optical principle, for example, in which the sequence of dark and light areas is detected by means of appropriate optical transmitters and receivers. Other embodiments of the sensors are also possible, i.e., sensors operating on a magnetic, inductive, electromagnetic, or capacitive principle or on combinations of these.

In the embodiment shown in FIGS. 3 and 4, the sensor or sensors of first and second sensor units 11, 12 detect coding 5 according to, for example, a capacitance measurement method by means of a capacitive distance sensor, in which the sensor and an opposing conductive surface form an electrical capacitor, wherein the opposing conductive surface, i.e., the strip conductors on the scale, and the distance determine the capacitance. It is also possible, however, to detect coding 5 by means of a sensor of some other type, such as an inductive sensor.

A control unit 13 records the measurement signals of first and second sensor units 11, 12 and evaluates them. So that the transitions between the scales can be detected with precision, the control unit 13 recognizes, on the basis of the signals received from sensor unit 11 or 12, whether or not a transition is present. On that basis, the system switches to whichever sensor is not positioned at the transition and receives and evaluates the signals received from it, so that the length data on the length scale which have been recorded can then be treated as output, either directly or indirectly.

FIG. 4 is a diagram similar to FIG. 3, wherein, in FIG. 4, three scales 1 according to FIG. 2 arranged next to each other are shown schematically. The arrangement of sensor units 11, 12 and of control unit 13 and the function of the elements are identical to those of the embodiment described on the basis of FIG. 3.

FIG. 5 shows a schematic diagram of the front of a third embodiment of the scale according to the invention. As in the first and second embodiments described above, scale 1 according to the invention comprises absolute track 3, relative track 4, and coding or coding track 5 on circuit board (PCB) 2. In this third embodiment, coding 5 comprises five coding elements 6, each of which is divided in the longitudinal direction into a plurality of coding segments. The individual coding segments of each coding element 6 represent an electrode, shown on the front in FIG. 5, none of which is conductively connected to the electrodes of the next coding segment adjacent in the longitudinal direction. At the edges, each scale 1 comprises, on the front, a reference electrode 9, which represents the second electrode of each electrode pair. Conductive connections 8 of each coding element 6 are not shown in FIG. 5, because, in this particular embodiment, they are not visible in the view presented, as will be explained below.

Figure 6:
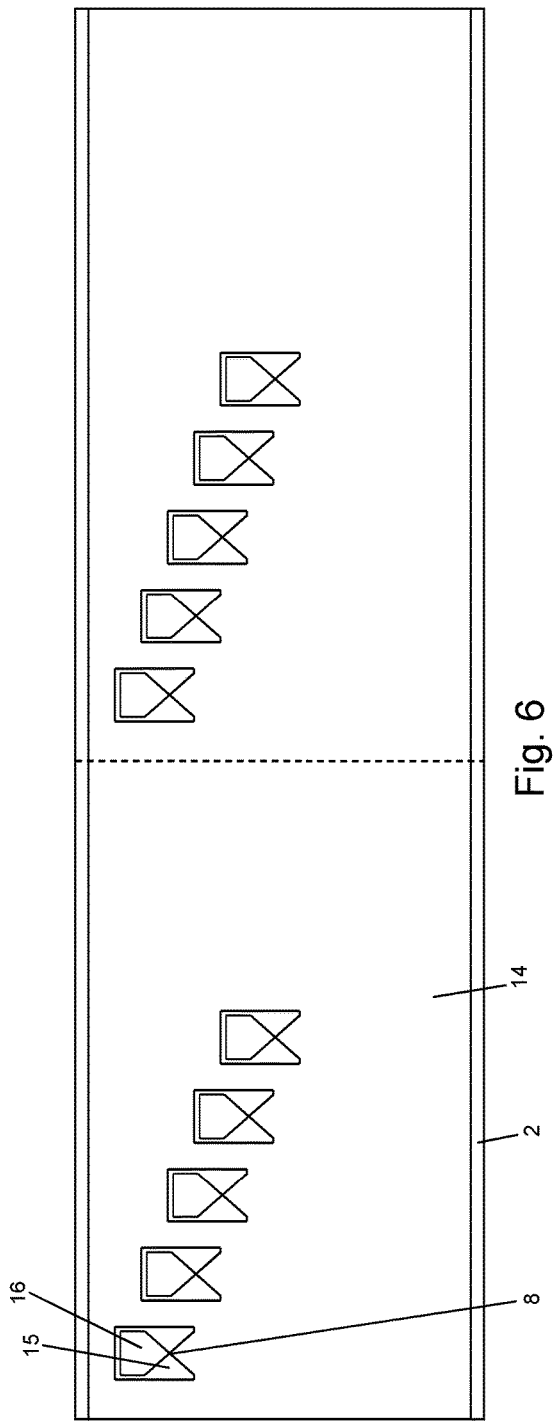
FIG. 6 is a schematic diagram of a section of the back of the third embodiment of the scale according to the invention.

FIG. 6 shows a schematic diagram of a section of the back of the third embodiment of the scale according to the invention with two coding segments. For illustrative reasons, the diagrams of FIGS. 5 and 6 are of different sizes and are therefore to be considered purely schematic. In FIG. 6, scale 1 comprises conductive area 14, extending over a large part of the back of printed circuit board 2; this area is contacted, i.e., electrically connected, via through-holes to reference electrode 9 and is therefore at the potential of reference electrode 9.

Conductive area 14 is provided with a number of nonconductive areas 15 corresponding to the number of coding elements 6, arranged at the level of each of the five coding elements 6 present on the front. Each nonconductive area 15 is assigned to coding element 6 and surrounds an electrode 16, which comprises, on one side, conductive connection 8, which is designed to be irreversibly destroyed for the purpose of coding. Conductive connection 8 in this embodiment is a connection between electrode 16 on the back and the associated electrode of coding element 6 on the front of scale 1. Such through-contacts (or "vertical interconnect accesses," VIAs) have been commonly used for integrated circuits for many years and serve chiefly to mount components on both the front and back of a circuit board (PCB) when there is not enough room on one side. Because FIGS. 5 and 6 show top views of the front and back of scale 1, the through-contacts cannot be seen. In the embodiment of the present invention as well, electrode 16 of coding element 6 has been arranged on the back of scale 1 because of the lack of space. Because the elements present on the back of scale 1, i.e., nonconductive surfaces 15, electrodes 16, and conductive connection(s) 8, cannot all be arranged directly under each other, they are laterally offset from each other. In the case of a scale of appropriate size, however, they could also be arranged under each other, as shown in the first and second embodiments.

In the embodiment shown in FIGS. 5 and 6, the breaking or destruction of conductive connection(s) 8 can be carried out from either side of scale 1, because the two electrodes 6, 9 are present and accessible on the front, and conductive area 14 and electrodes 16 are present and accessible on the back. It is also possible to make electrical contact on both sides to cause the destruction and thus to produce the coding. For this purpose, an especially suitable contacting or coding device can be used, which, for example, can comprise several contact elements for the simultaneous contacting of a plurality of electrodes. The contacting or coding device is appropriately programmed and performs the coding of the each scale automatically. It is possible in this case to produce the coding either before or after the final incorporation of the scales into the measuring system.

The breaking or destruction of conductive connection 8 for each coding element 6 or in each coding segment makes use, in the preferred embodiment, of the properties and functionality of a PCB safety fuse. It must be ensured that the potential differences and currents upon application of the contacting or coding device are sufficiently high, so that it will be ensured that conductive connection 8 is destroyed reliably and permanently.

The present invention is applicable not only to length-measuring systems with a straight orientation but also to angle-measuring systems with scales shaped as corresponding segments of a circle.

The subject matter according to the invention provides a measuring system which can be manufactured at low cost by mass production with mature technologies and without complicated fabrication techniques. It guarantees reliable measurement and is flexible and variable in its applications.

A wide variety of materials are available for the various parts discussed and illustrated herein. While the principles of this device have been described in connection with specific embodiments, it should be understood clearly that these descriptions are made only by way of example and are not intended to limit the scope of the application.

The invention claimed is:

1. A scale for a length-measuring system for recording the absolute values of angles or distances, the scale comprising: (a) a printed circuit board including at least one track for identifying length information or angle information; and (b) a coding for identifying the scale, the coding having at least one coding element with at least two electrodes and a conductive connection between the electrodes on an insulator substrate, wherein the conductive connection is configured to be irreversibly destroyed by applying an electrical current.

2. The scale of claim 1 wherein the at least one coding element is segmented into a plurality of coding segments and each coding segment comprises two electrodes with a conductive connection between them.

3. The scale of claim 1 wherein the electrodes of each coding segment are separated from each other in terms of their potentials.

4. The scale of claim 1 further including an absolute track and an incremental track.

5. The scale of claim 4 wherein the absolute track and/or the incremental track is configured as a strip conductor, a magnetic trace or a printed trace.

6. The scale of claim 1 wherein the printed circuit board is produced by photochemical means, by stamping or wire-laying methods, by screen printing or by milling.

7. The scale of claim 2 wherein the conductive connection includes a predetermined breaking point.

8. The scale of claim 2 wherein the conductive connection can be visually inspected by a person whether it is intact or irreversibly destroyed.

9. A length-measuring system for recording the absolute values of angles or distances comprising:
a plurality of scales arranged next to each other and each scale including (a) a printed circuit board with at least one track for identifying length information or angle information; and (b) coding for identifying each scale, the coding having at least one coding element with at least two electrodes and a conductive connection between the electrodes on an insulator substrate, wherein the conductive connection is configured to be irreversibly destroyed by applying an electrical current;
a first sensor unit having at least one sensor for recording the length or angle data of each of the plurality of scales;
wherein the length information or angle information on the at least one track of each scale are identical; and the coding of each scale of the length-measuring system is configured in such a way that it differs from another scale by at least one coding element.

10. The length-measuring system of claim 9 further including a second sensor unit with at least one sensor for recording the length information or angle information and the coding of each of the plurality of scales and a control unit.

11. The length-measuring system of claim 10 wherein the measurement principle of the sensors of the first and/or second sensor unit is based on an optical, magnetic, inductive, electromagnetic, or capacitance measurement method or on a combination of said measurement methods.

12. A method for the production of a length-measuring system for recording the absolute values of angles or distances, the method comprising:
providing a plurality of identical scales, each scale including (a) a printed circuit board with at least one track for identifying length information or angle information; and (b) a coding for identifying each scale, the coding having at least one coding element with at least two electrodes and a conductive connection between the electrodes on an insulator substrate, the length information or angle information on the at least one track of each scale and the coding elements of each scale of the length-measuring system are identical;
arranging the plurality of scales next to each other; and
identifying each of the plurality of scales by the selective application of a current to at least one coding element, so that each of the plurality of scales comprises a different coding caused by the application of a current.

13. The method of claim 12 wherein the arranging and identifying steps can be carried out in the reverse order.

* * * * *